(12) United States Patent
Nam et al.

(10) Patent No.: US 12,342,464 B2
(45) Date of Patent: Jun. 24, 2025

(54) DRIVING STRUCTURE OF DISPLAY DEVICE AND DISPLAY DEVICE HAVING THE SAME

(71) Applicant: Samsung Display Co., LTD., Yongin-si (KR)

(72) Inventors: Young-Joo Nam, Suwon-si (KR); Dong Wan Choi, Seoul (KR); Jooyoung Kim, Asan-si (KR); Hyun Seop Song, Bucheon-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 296 days.

(21) Appl. No.: 18/074,575

(22) Filed: Dec. 5, 2022

(65) Prior Publication Data
US 2023/0269875 A1    Aug. 24, 2023

(30) Foreign Application Priority Data
Feb. 22, 2022   (KR) .................. 10-2022-0023045

(51) Int. Cl.
*H05K 1/14*   (2006.01)
*H05K 5/02*   (2006.01)

(52) U.S. Cl.
CPC ........... *H05K 1/147* (2013.01); *H05K 5/0226* (2013.01); *H05K 2201/10128* (2013.01)

(58) Field of Classification Search
CPC .... G02F 1/13452; H05K 1/028; H05K 1/147; H05K 1/189; H05K 1/14; H05K 2201/056; H05K 2201/10128; H05K 5/0226; H05K 5/02

USPC ......................................................... 361/749
See application file for complete search history.

(56) References Cited

U.S. PATENT DOCUMENTS

2020/0221576 A1*   7/2020   Tseng .................. G02B 6/0081

FOREIGN PATENT DOCUMENTS

| KR | 1020130025097 A | 3/2013 |
|---|---|---|
| KR | 102113610 B1 | 6/2020 |
| KR | 1020210035148 A | 3/2021 |
| KR | 102254761 B1 | 5/2021 |

* cited by examiner

*Primary Examiner* — Timothy J Thompson
*Assistant Examiner* — Guillermo J Egoavil
(74) *Attorney, Agent, or Firm* — CANTOR COLBURN LLP

(57) ABSTRACT

A display device including a display panel, a circuit board connected to the display panel, and a flexible circuit film which connects the display panel to the circuit board, the flexible circuit film being bendable. The circuit board includes an electronic component, a first area at which the circuit board is connected to the flexible circuit film, and a second area which is adjacent to the first area and corresponds to the electronic component. The flexible circuit film which is bent disposes the first area of the circuit board overlapping the display panel, together with both the second area of the circuit board and the electronic component non-overlapping the display panel, along a thickness direction of the display device.

19 Claims, 14 Drawing Sheets

DRIVING STRUCTURE OF DISPLAY DEVICE AND DISPLAY DEVICE HAVING THE SAME

This application claims priority to Korean Patent Application No. 10-2022-0023045 filed on Feb. 22, 2022, and all the benefits accruing therefrom under 35 U.S.C. § 119, the entire contents of which are incorporated herein by reference.

BACKGROUND

1. Field

The present disclosure relates to a display device.

2. Description of the Related Art

Display devices include a liquid crystal display (LCD), a plasma display panel (PDP), an organic light emitting diode display device (OLED device), a field emission display (FED), an electrophoretic display, etc.

In general, a display device includes a display panel in which a plurality of pixels are disposed and a driver for driving the pixels. The driver includes a gate driver disposed on the display panel and connected to the pixels and a data driver connected to one side of the display panel to be connected to the pixels.

This driver includes a plurality of driving chips, and the driving chips are disposed on flexible circuit films. The flexible circuit films are connected to the display panel and the printed circuit board (PCB). The flexible circuit films are bent toward the side of the back surface of the display panel so that the printed circuit board (PCB) may be disposed on the side of the back surface of the display panel, which is the back surface of the display panel.

On the other hand, in order to increase a screen-to-body ratio of the display device, that is, a ratio occupied by the screen when the display device is viewed from the front, efforts to reduce the width of the peripheral area disposed around the display area are being executed.

SUMMARY

In a state in which electronic components are mounted on a printed circuit board (PCB) within a display device, the PCB is connected to a flexible circuit board and disposed to face the back surface of the display panel at a peripheral area of the display device. While the width of the peripheral area may decrease, an overall thickness of the display device at the peripheral area of may increase owing to the various elements disposed facing the back surface of the display panel.

Embodiments are to provide a display device capable of reducing the width of the peripheral area adjacent to the display area, together with reducing the thickness of the display device at the peripheral area.

However, the problems to be solved by the embodiments are not limited to the above-described problems, and may be variously expanded in the range of the technical ideas included in the embodiments.

A display device according to an embodiment includes a display panel including a plurality of pixels, a flexible circuit film connected to the display panel and bent to the back surface of the display panel, a circuit board connected to the flexible circuit film, and a plurality of electronic components on the circuit board. The circuit board includes a first area overlapping the display panel and a second area that does not overlap the display panel along a thickness direction of the display panel, and the plurality of electronic components are in the second area of the circuit board.

The display panel, the flexible circuit film, and the first area of the circuit board may overlap each other, along the thickness direction.

A connection part between the flexible circuit board and the circuit board may be further included, the flexible circuit board and the circuit board may be connected to each other through the connection part, and the display panel, the flexible circuit film, the connection part and the first area of the circuit board may overlap each other, along the thickness direction.

The flexible circuit film may be under the display panel, the connection part may be under the flexible circuit film, and the first area of the circuit board may be under the connection part, along the thickness direction.

A plurality of electronic components may be under the second area of the circuit board, along the thickness direction.

A plurality of electronic components may be over the second area of the circuit board, along the thickness direction.

The first area of the circuit board may be under the display panel, the connection part may be under the first area of the circuit board, the flexible circuit film may be under the connection part, and a plurality of electronic components may be over the second area of the circuit board, along the thickness direction.

The flexible circuit film may surround the first area and the second area of the circuit board, and a plurality of electronic components.

A moving part next to the second area of the circuit board and driving the movement of the display panel may be further included.

The width of the first area and the width of the second area of the circuit board may be different.

The width of the first area of the circuit board may be wider than the width of the second area of the circuit board.

A display device according to an embodiment includes a display panel including a display area including a plurality of pixels arranged along a first direction and a second direction, and a non-display area at an edge of the display area, and a driving area including a flexible circuit film bent to the back surface of the display panel and a circuit board connected to the flexible circuit film. The non-display area of the display panel overlaps the part of the driving area along the second direction, the first area of the circuit board overlaps the display panel, and the second area of the circuit board does not overlap the display panel, along a third direction perpendicular to the first direction and the second direction.

A connection part between the first area of the circuit board and the flexible circuit film, and a plurality of electronic components in the second area of the circuit board may be further included.

According to the display device according to embodiments, the width of the peripheral area around the display area may be reduced, together with the thickness of the peripheral area being reduced.

However, the effects of the embodiments are not limited to the above-described effects, and it is apparent that the invention can be variously expanded within a range that does not deviate from the spirit and area of the invention.

BRIEF DESCRIPTION OF THE DRAWINGS

The above and other advantages and features of this disclosure will become more apparent by describing in further detail embodiments thereof with reference to the accompanying drawings, in which.

DETAILED DESCRIPTION

Figure 1:
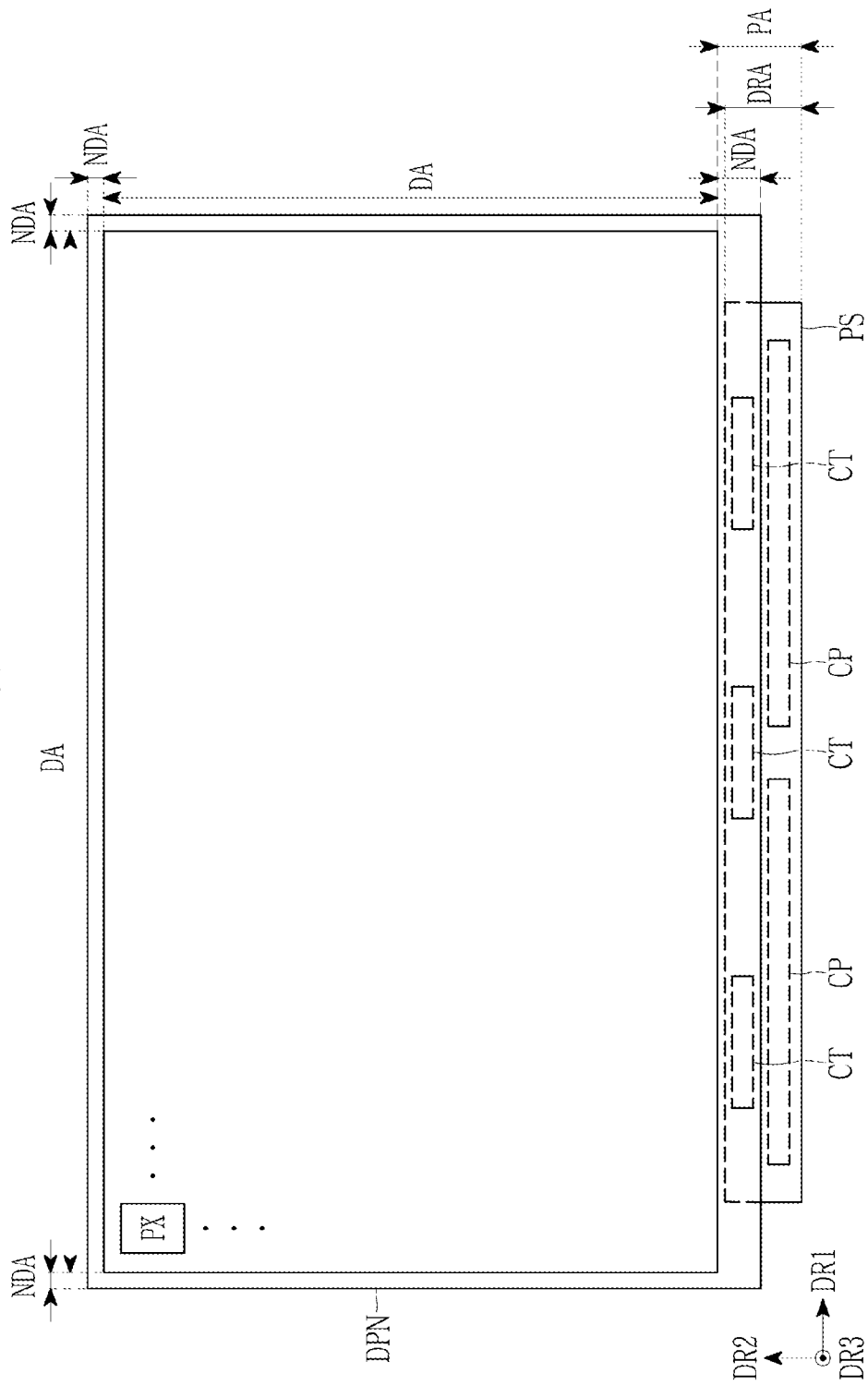
FIG. 1 is a top plan view of a display device according to an embodiment.

The invention will be described more fully hereinafter with reference to the accompanying drawings, in which embodiments are shown. As those skilled in the art would realize, the described embodiments may be modified in various different ways, all without departing from the spirit or scope of the embodiments.

Descriptions of parts not related to the embodiments are omitted, and like reference numerals designate like elements throughout the specification. As used herein, a reference number may indicate a singular element or a plurality of the element. For example, a reference number labeling a singular form of an element within the drawing figures may be used to reference a plurality of the singular element within the text of specification.

In addition, the attached drawings are only for easy understanding of embodiments disclosed in the present specification, and technical ideas disclosed in the present specification are not limited by the attached drawings, and it should be understood to include all modifications, equivalents, or substitutes included in the ideas and technical ranges of the embodiments.

Further, since sizes and thicknesses of constituent members shown in the accompanying drawings are arbitrarily given for better understanding and ease of description, the embodiments are not limited to the illustrated sizes and thicknesses. In the drawings, the thickness of layers, films, panels, areas, etc., are exaggerated for clarity. In the drawings, for better understanding and ease of description, the thicknesses of some layers and areas are exaggerated.

In addition, it will be understood that when an element such as a layer, film, area, or substrate is referred to as being related to another element such as being "on" another element, it can be directly on the other element or intervening elements may also be present. In contrast, when an element is referred to as being related to another element such as being "directly on" another element, there are no intervening elements present. Further, in the specification, the word "on" or "above" means positioned above or below the object portion, and does not necessarily mean positioned on the upper side of the object portion based on a gravitational direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. In addition, unless explicitly described to the contrary, the word "comprise", and variations such as "comprises" or "comprising", will be understood to imply the inclusion of stated elements but not the exclusion of any other elements.

Further, in the specification, the phrase "on a plane" means when an object portion is viewed from above, and the phrase "on a cross-section" means when a cross-section taken by vertically cutting an object portion is viewed from the side.

In addition, in the specification, when referring to "connected to", this does not only mean that two or more constituent elements are directly connected to, but also that two or more constituent elements are electrically connected through other constituent elements as well as being indirectly connected to and being physically connected to, or it may mean that they are referred to by different names according to a position or function, but are integrated.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, various embodiments and variations are described in detail with reference to accompanying drawings.

A display device according to an embodiment is described with reference to FIG. 1 to FIG. 3. FIG. 1 is a top plan view of a display device according to an embodiment, FIG. 2 is a top plan view showing a part of a back surface of a display device of FIG. 1, and FIG. 3 is a cross-sectional view showing a part of FIG. 1.

Figure 2:
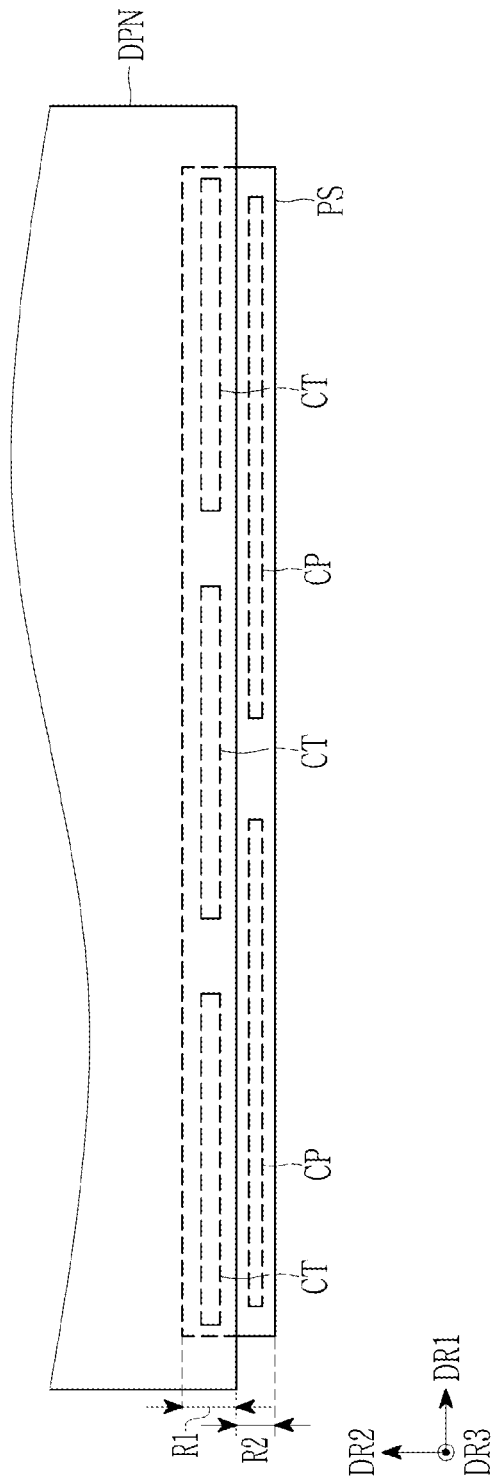
FIG. 2 is a top plan view showing a part of a back surface of a display device of FIG. 1.
Figure 3:
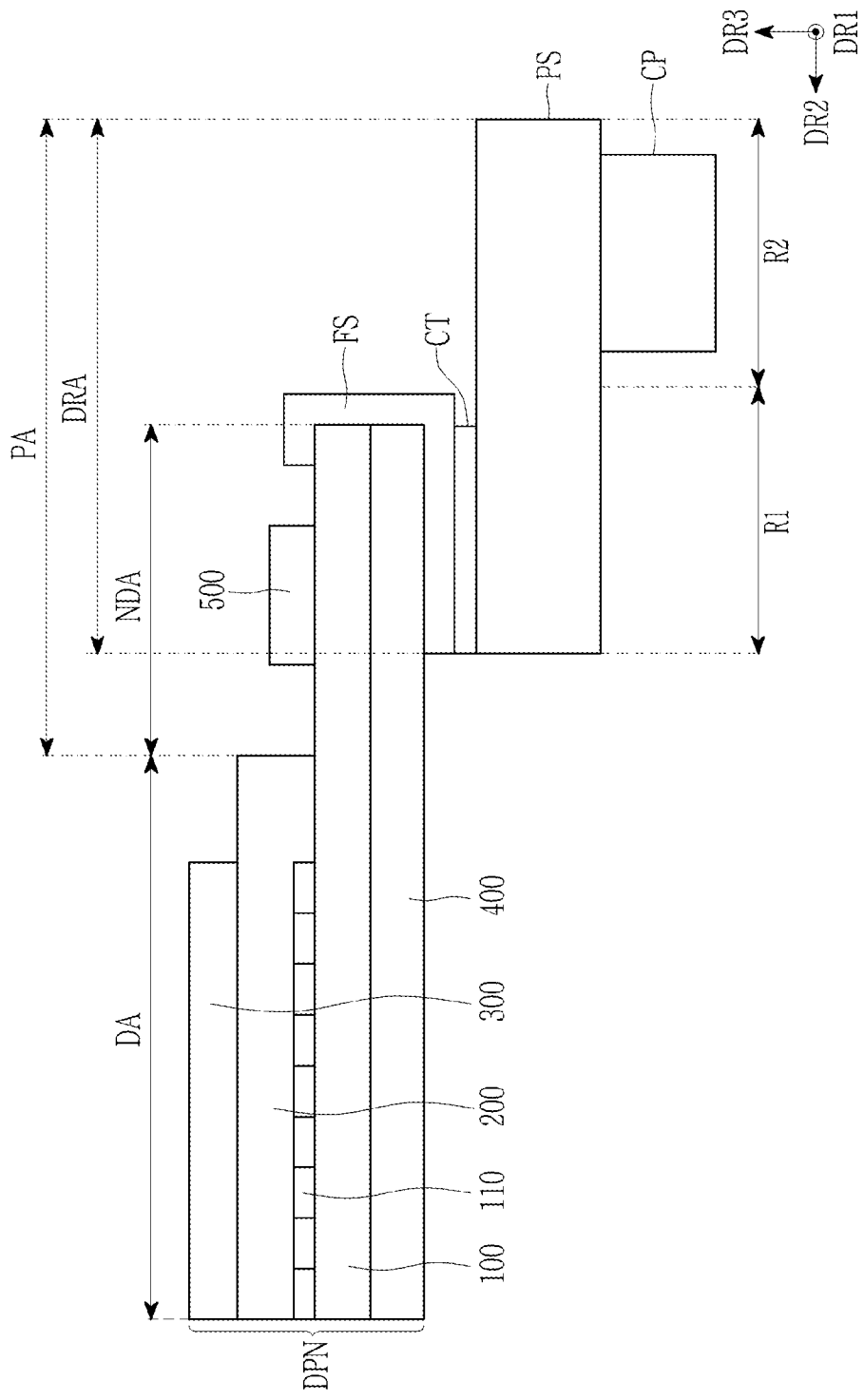
FIG. 3 is a cross-sectional view showing a part of FIG. 1.

Referring to FIG. 1 to FIG. 3, the display device according to the present embodiment may include a display panel DPN including a display area DA in which a pixel PX provided in plural including a plurality of pixels PX arranged along a first direction DR1 and a second direction DR2 different from each other is disposed and an image is displayed, and a non-display area NDA which is adjacent to the display area DA. In an embodiment, the non-display area NDA may surround the display area DA, without being limited thereto.

Outside of the non-display area NDA of the display panel DPN, a driving area DRA including a flexible circuit film FS connected to the display panel DPN and bendable to be bent toward the back surface of the display panel DPN, and a circuit board PS physically and electrically connected to the flexible circuit film FS through a connection part CT may be disposed. In an embodiment, the driving area DRA may include a portion of the flexible circuit film FS corresponding to the first area R1 of the circuit board PS, together with the circuit board PS connected to the flexible circuit film FS. As shown in FIG. 3, the flexible circuit film FS which is bent disposes a distal end portion of the flexible circuit film FS and the circuit board PS facing a rear surface of the display panel DPN. The non-display area NDA and the driving area DRA which are each disposed outside the display area DA together form a peripheral area PA. A width of the peripheral area PA may be taken along a plane defined by the first direction DR1 and the second direction DR2 crossing each other, for example, in a direction normal to a respective edge of the display area DA. As the width of the peripheral area PA becomes narrower, a screen-to-body ratio of the display device, that is, a display area-to-peripheral area ratio, may increase.

Referring to the plan view of FIG. 1, a portion of the driving area DRA may be disposed below the non-display area NDA of the display panel DPN along the second direction DR2, but is not limited thereto.

The circuit board PS may include a first area R1 at which the circuit board PS is connected to the flexible circuit film FS through the connection part CT, and a second area R2 extending from the first area R1 and including a plurality of electronic components CP. The electronic component CP may be a driving component of the circuit board PS, without being limited thereto.

In the display device which is bent at the flexible circuit film FS, the first area R1 of the circuit board PS is disposed on (and facing) the back surface of the display panel DPN along the third direction DR3 which crosses each of the first direction DR1 and the second direction DR2. In an embodiment, the third direction DR3 may be perpendicular to the first direction DR1 and the second direction DR2, without being limited thereto. In the display device which is bent at the flexible circuit film FS, the first area R1 of the circuit board PS may overlap the display panel DPN, but the second area R2 of the circuit board PS may not overlap the display panel DPN, along the third direction DR3. An element which does not overlap another element, may be outside of, adjacent to and/or spaced apart from the another element, alone a plane. The third direction DR3 as a direction parallel to a normal direction to a front surface of the display panel DPN which is opposite to the rear surface, and may define a thickness direction of the display panel DPN, of the display device and/or of various components or layers thereof. In an embodiment, the flexible circuit film FS which is bent disposes the first area R1 of the circuit board PS overlapping the display panel DNP, together with both the second area R2 of the circuit board PS and the electronic component CT non-overlapping the display panel DNP, along a thickness direction of the display device DNP.

The display panel DPN may include a substrate 100 on which a plurality of light emitting parts 110 is disposed as a light emitting layer, an encapsulation layer 200 disposed over the plurality of light emitting parts 110 of the substrate 100, a polarization part 300 disposed over the encapsulation layer 200, and a protection part 400 disposed under the substrate 100 in both the display area DA and the non-display area NDA.

The display panel DPN may further include a circuit part 500 disposed on the substrate 100 and disposed in the non-display area NDA of the substrate 100. One or more of the flexible circuit film FS, the circuit board PS, the connection part CT, the electronic component CP and the circuit part 500 may together form a driving structure of the display device, without being limited thereto.

The flexible circuit film FS may be bendable and the display device may be bendable at the flexible circuit film FS. The flexible circuit film FS may be connected to the substrate 100 a front surface of the substrate 100 and at an end portion (or edge portion thereof). The flexible circuit film FS may be bent from the front surface at the end portion the substrate 100, along a side surface of the substrate 100 which connects the front and rear surfaces to each other, and to the back surface of the display panel DPN, so that the part of the flexible circuit film FS may be disposed on (and facing) the back surface of the display panel DPN.

The connection part CT may be disposed between an end portion of the flexible circuit film FS and the first area R1 of the circuit board PS which are on the back surface of the display panel DPN, and the first area R1 of the circuit board PS and the end portion of the flexible circuit film FS may be connected to each other through the connection part CT. Through this, the circuit board PS and the display panel DPN may be electrically connected to each other at a rear of the display panel DPN.

A flexible circuit film FS which is connected to an end portion of the display panel DPN and not bent to dispose an end portion thereof at the rear of the display panel DPN, may be extended along the second direction DR2 from the end portion of the display pane DPN. The flexible circuit film FS which is unbent, increases a dimension (e.g., width) of the peripheral area PA along the second direction DR2. The flexible circuit film FS which is connected to an end portion of the display panel DPN and bent so as to dispose end portions of both the flexible circuit film FS and the circuit board PS on the back surface of the display panel DPN, reduces a width of the peripheral area PA along the second direction DR2.

The connection part CT may include an anisotropic conductive film, and for example, a plurality of conductive balls may be included in the layer having a contact force. A planar area of the connection part CT may correspond to a contact area (or connection area) between the circuit board PS and the flexible circuit film FS. In the display device which is bent at the flexible circuit film FS, the connection area may be disposed at a rear of the display panel DPN to further reduce a dimension (e.g., width) of the peripheral area PA along the second direction DR2.

When attaching the first area R1 of the circuit board PS to the flexible circuit film FS through the connection part CT, the connection part CT may be disposed on one of these components, and then pressed between the flexible circuit film FS and the first area R1 of the circuit board PS.

Since the connection part CT as a connection area between components overlaps the back surface of the display panel DPN, the connection part CT may be supported by the display panel DPN during the pressing process.

A plurality of electronic components CP may be disposed in the second area R2 of the circuit board PS, and the electronic components CP may not overlap the display panel DPN along the third direction DR3. In the display device which is bent at the flexible circuit film FS, the circuit board PS may include an upper surface closest to the display panel DPN and a lower surface opposite to the upper surface. Referring to FIG. 1 to FIG. 3, the plurality of electronic components CP correspond to the lower surface of the circuit board PS and extend from the circuit board PS along the third direction DR3 and away from the display panel DPN.

Therefore, a space is secured for the second area R2 of the circuit board PS and the electronic components CP to move in the third direction DR3 during set assembly, and accordingly, an overall thickness of the third direction DR3 of the display device may be reduced.

If, in addition to the first area R1 of the circuit board PS, the second area R2 of the circuit board PS including the electronic components CP is also disposed to overlap the display panel DPN along the third direction DR3, and during the set assembly, the thickness of the display device measured in the third direction DR3 includes the electronic components CP as well as the thickness of the display panel DPN and the thickness of the circuit board PS. As such, unlike the display device according to the present embodiment, in addition to the first area R1 of the circuit board PS, when the second area R2 of the circuit board PS where the electronic components CP are mounted is also disposed to overlap the display panel DPN along the third direction DR3, the entire thickness of the display device becomes thicker.

In addition, as described above, according to the present embodiment, as the flexible circuit film FS is bent and then overlaps the connection part CT and the first area R1 of the circuit board PS on the back surface of the display panel DPN, the part of the driving area DRA where the driving part is disposed may partially overlap the non-display area NDA of the display panel DPN. Therefore, compared to the case where the entire circuit board PS does not overlap the display panel DPN and the driving area DRA in which the driving part is disposed does not overlap the non-display area NDA of the display panel DPN, the sum of the width of the non-display area NDA and the width of the driving area DRA measured along the second direction DR2 may decrease. Through this, according to the present embodiment, the width of the peripheral area PA measured along the second direction DR2 may be reduced, and the width of the bezel of the display device may be reduced.

As above-described, according to the display device according to the present embodiment, the flexible circuit film FS is bent to dispose the connection part CT and the first area R1 of the circuit board PS on the back surface of the display panel DPN along the third direction DR3 of the thickness direction, the second area R2 of the circuit board PS does not overlap the display panel DPN along the third direction DR3, and the electronic components CP are disposed in the second area R2 of the circuit board PS, an increase of the display device be prevented while the width of the peripheral area PA measured along the second direction DR2 decreases.

In the illustrated embodiment, the width parallel to the first direction DR1 of the display panel DPN is shown to be larger than the width parallel to the second direction DR2, but the invention is not limited thereto. In addition, in the illustrated embodiment, the circuit board PS is shown to be disposed below the display panel DPN along the second direction DR2, but is not limited thereto.

Figure 4:
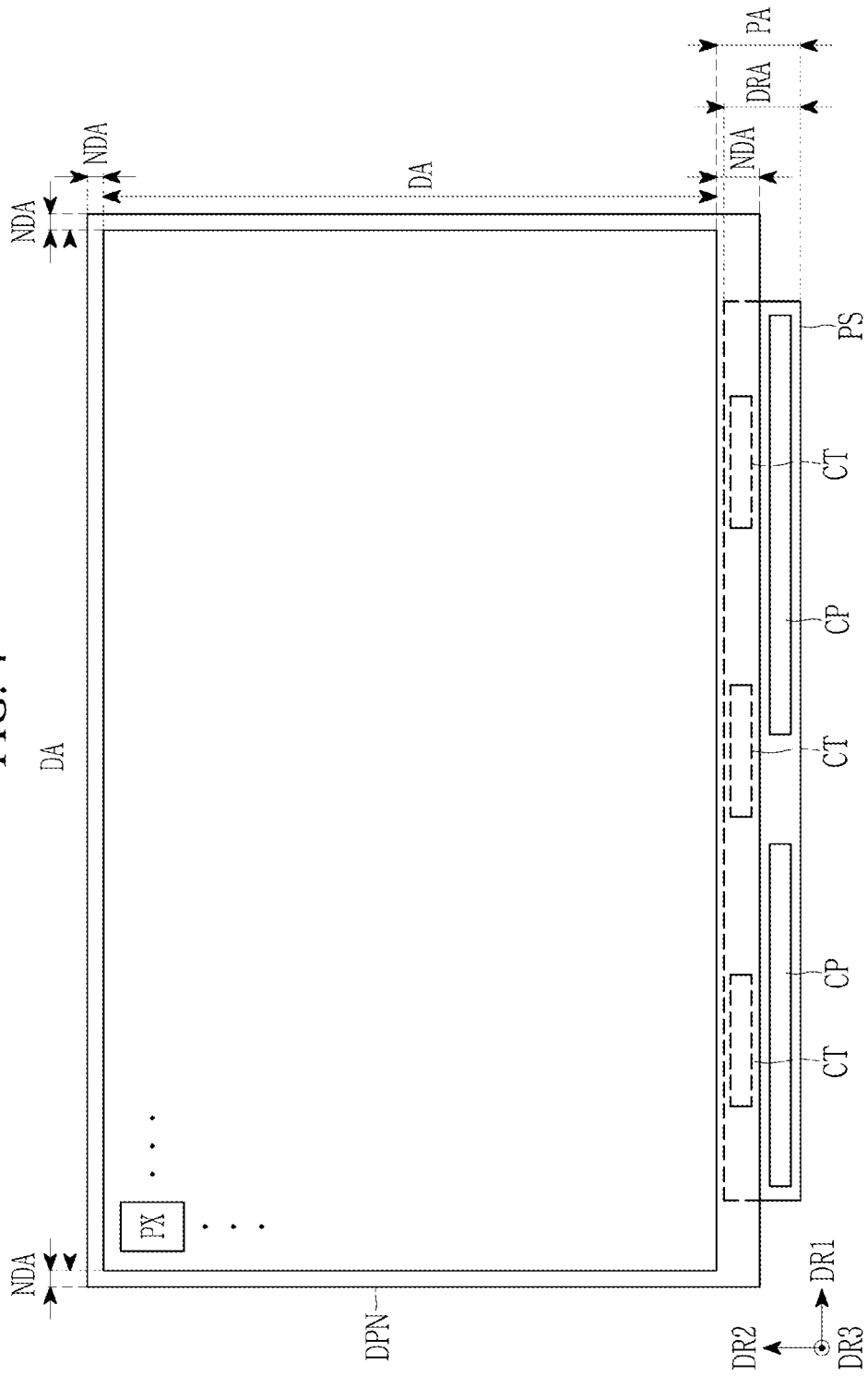
FIG. 4 is a top plan view of a display device according to an embodiment.

Then, a display device according to an embodiment is described with reference to FIG. 4 to FIG. 6. FIG. 4 is a top plan view of a display device according to an embodiment, FIG. is a top plan view showing a part of a back surface of a display device of FIG. 4, and FIG. 6 is a cross-sectional view showing a part of FIG. 4.

Figure 5:
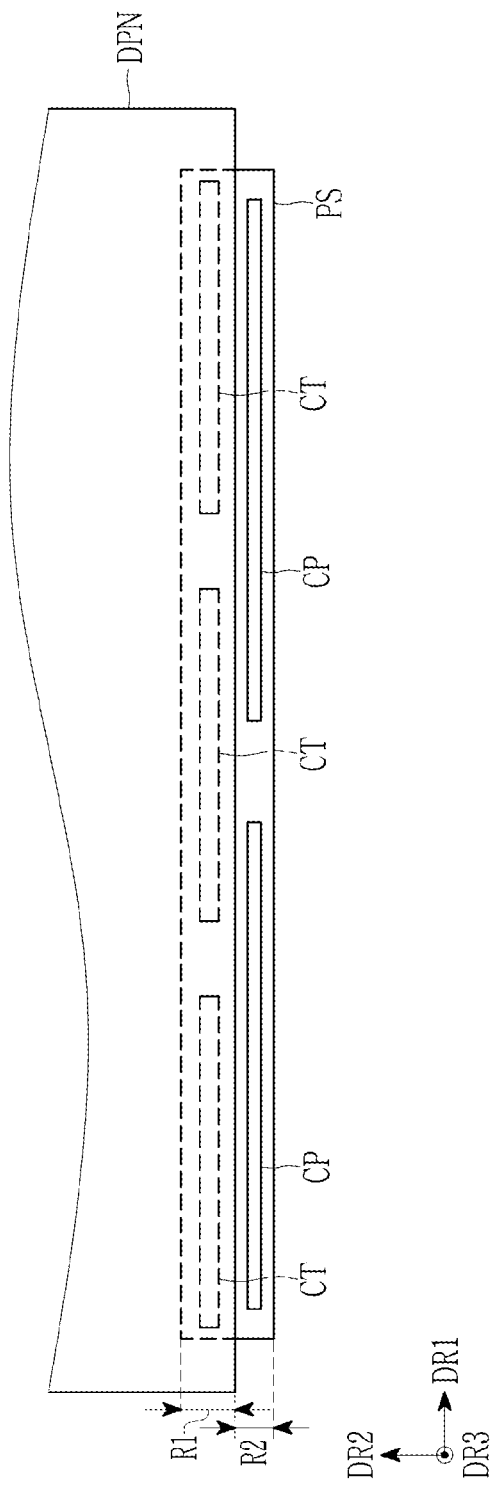
FIG. 5 is a top plan view showing a part of a back surface of a display device of FIG. 4.
Figure 6:
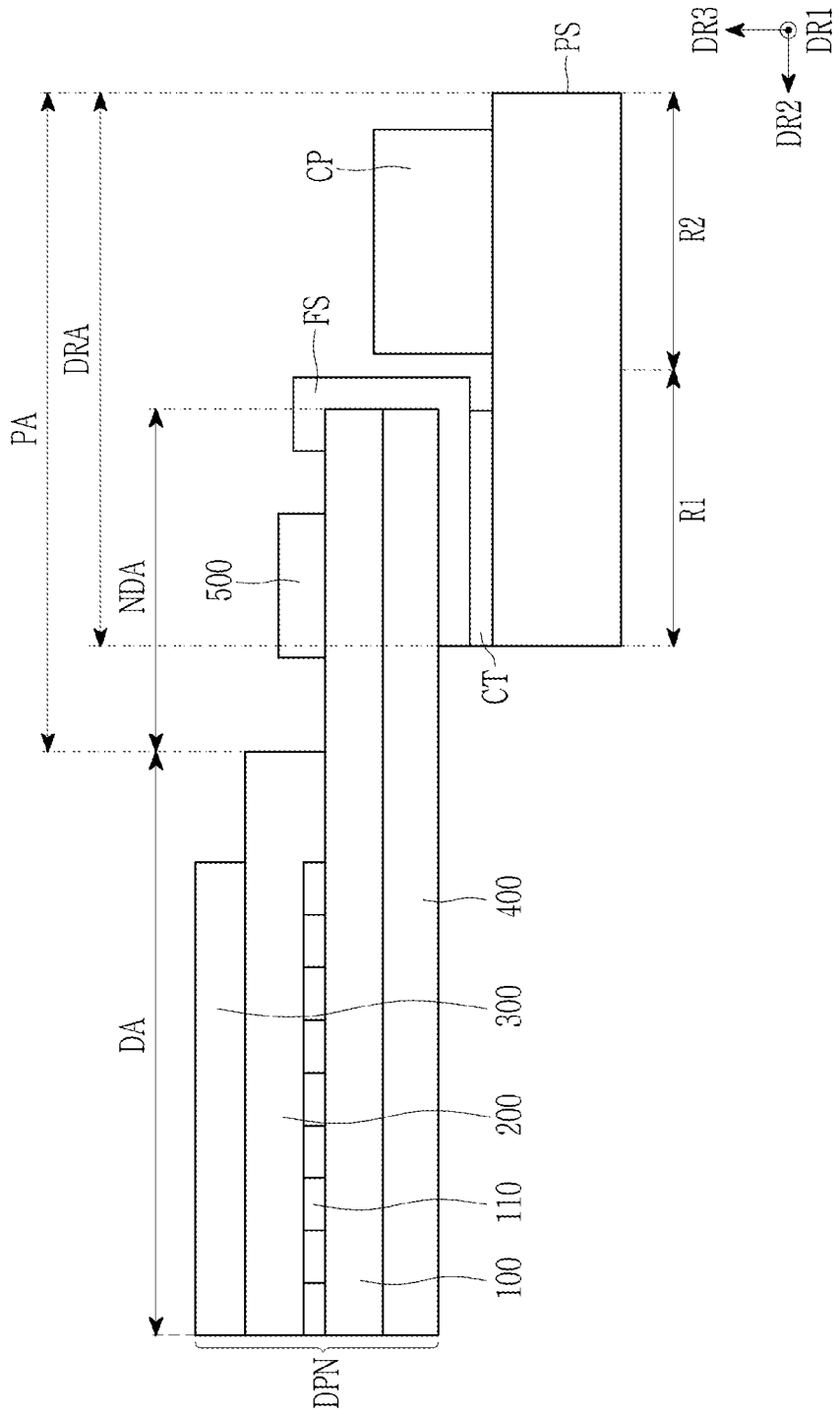
FIG. 6 is a cross-sectional view showing a part of FIG. 4.

Referring to FIG. 4 to FIG. 6, the display device according to the present embodiment is similar to the display device according to the embodiment described with reference to FIG. 1 to FIG. 3. A detailed description of the same constituent elements is omitted.

Referring to FIG. 4 to FIG. 6, the display device according to the present embodiment may include a flexible circuit film FS connected to an end portion of the display panel DPN including the display area DA, the non-display area NDA and the driving area DRA, and bent onto the back surface of the display panel DPN, a circuit board PS connected to the flexible circuit film FS through the connection part CT, and a plurality of electronic components CP mounted on the circuit board PS.

The circuit board PS may include a first area R1 connected to the flexible circuit film FS through the connection part CT, and a second area R2 extending from the first area R1 and including a plurality of electronic components CP.

The first area R1 of the circuit board PS is disposed on the back surface of the display panel DPN along the third direction DR3 and overlaps the display panel DPN, however is not limited thereto. In an embodiment, the second area R2 of the circuit board PS may not overlap the display panel DPN along the third direction DR3.

The display panel DPN may include a substrate 100 in which a plurality of light emitting parts 110 are disposed, an encapsulation layer 200 disposed on a plurality of light emitting parts 110 of the substrate 100, a polarization part 300 disposed on the encapsulation layer 200, a protection part 400 disposed under the substrate 100, and a circuit part 500 disposed on the substrate 100 and disposed in the non-display area NDA of the substrate 100.

The flexible circuit film FS may be connected to the substrate 100 and be bent from a front surface of the substrate 100 and onto the back surface of the display panel DPN, so that the part of the flexible circuit film FS may be disposed on the back surface of the display panel DPN.

The connection part CT may be disposed between the part disposed on the back surface of the display panel DPN among the flexible circuit film FS and the first area R1 of the circuit board PS, and the first area R1 of the circuit board PS and the part disposed on the back surface of the display panel DPN among the flexible circuit film FS may be connected to each other through the connection part CT. Through this, the circuit board PS and the display panel DPN may be electrically connected to each other.

A plurality of electronic components CP may be disposed in the second area R2 of the circuit board PS, and the electronic components CP may not overlap the display panel DPN along the third direction DR3.

Unlike the embodiment previously described with reference to FIG. 1 to FIG. 3, the electronic components CP of the display device according to the present embodiment may be disposed above the second area R2 of the circuit board PS along the third direction DR3. In the display device which is bent at the flexible circuit film FS, the circuit board PS may include an upper surface closest to the display panel DPN and a lower surface opposite to the upper surface. Referring to FIG. 4 to FIG. 6, the plurality of electronic components CP correspond to the upper surface of the circuit board PS.

Therefore, the electronic components CP are disposed above the second area R2 of the circuit board PS and disposed so as to not overlap the display panel DPN along the third direction DR3, so that the thickness of the third direction DR3 of the display device may be reduced.

Also, as described above, as the flexible circuit film FS is bent and disposes the connection part CT and the first area R1 of the circuit board PS on the back surface of the display panel DPN, compared to the case where the entire circuit board PS does not overlap the display panel DPN, the sum of the width of the non-display area NDA and the width of the driving area DRA measured along the second direction DR2 may decrease. Accordingly, the width of the peripheral area PA measured along the second direction DR2 may be reduced, and the width of the bezel of the display device may be reduced.

As such, according to the display device according to the present embodiment, the flexible circuit film FS is bent and then disposes the connection part CT and the first area R1 of the circuit board PS along the third direction DR3 on the back surface of the display panel DPN, the second area R2 of the circuit board PS does not overlap the display panel DPN along the third direction DR3, and the electronic components CP are disposed in the second area R2 of the circuit board PS. Accordingly, the thickness increase of the display device may be prevented while decreasing the width of the peripheral area PA measured along the second direction DR2.

Many features of the display device according to the embodiment previously described with reference to FIG. 1 to FIG. 3 are applicable to the display device according to the present embodiment.

Figure 7:
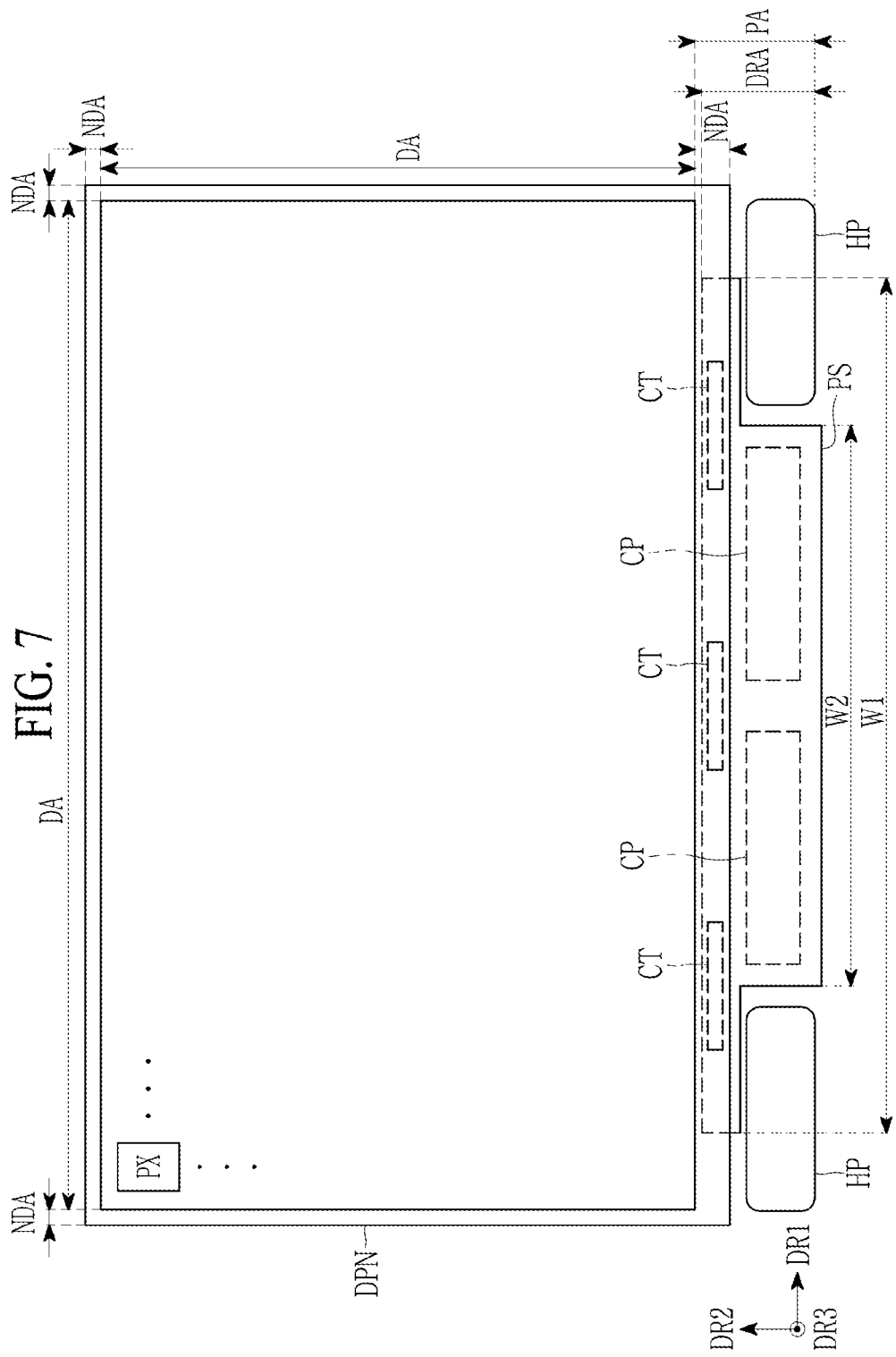
FIG. 7 is a top plan view of a display device according to an embodiment.

A display device according to an embodiment is described with reference to FIG. 7 to FIG. 9. FIG. 7 is a top plan view of a display device according to an embodiment, FIG. 8 is a top plan view showing a part of a back surface of a display device of FIG. 7, and FIG. 9 is a cross-sectional view showing a part of FIG. 7.

Figure 8:
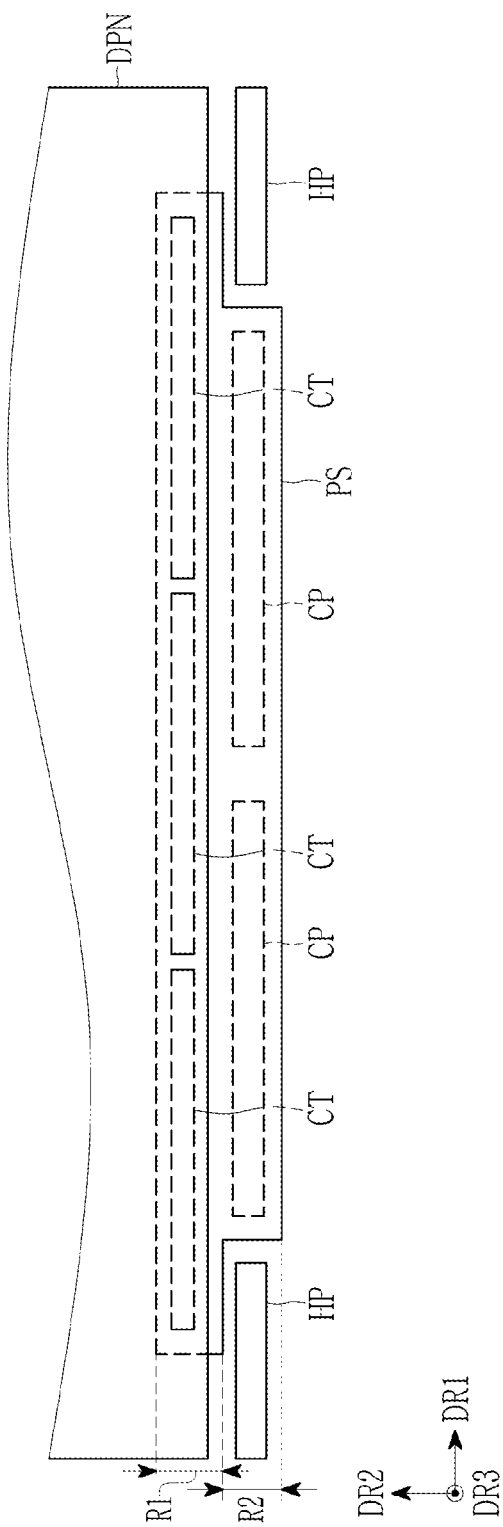
FIG. 8 is a top plan view showing a part of a back surface of a display device of FIG. 7.
Figure 9:
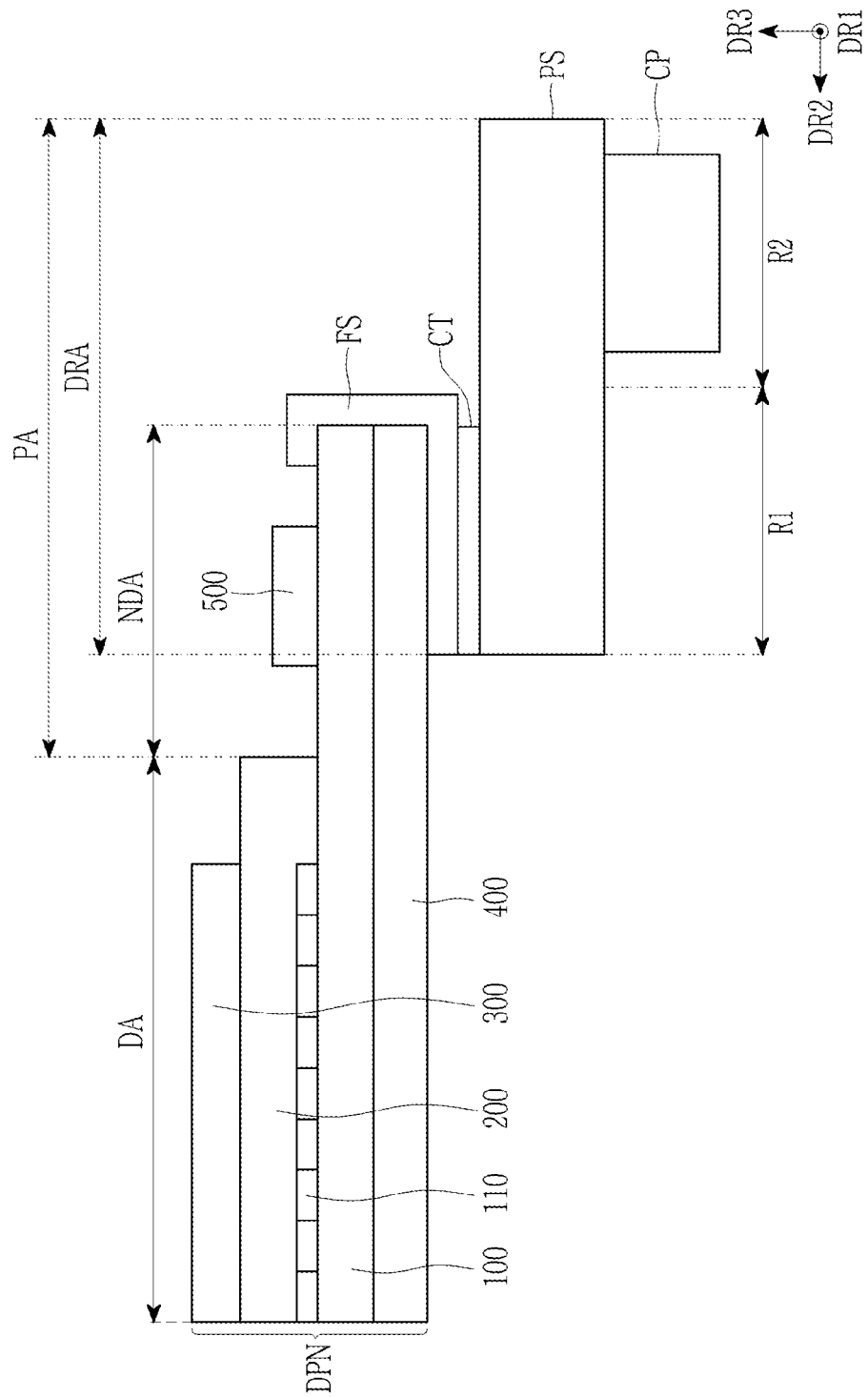
FIG. 9 is a cross-sectional view showing a part of FIG. 7.

Referring to FIG. 7 to FIG. 9, the display device according to the present embodiment is similar to the display device according to the embodiment described with reference to FIG. 1 to FIG. 3. A detailed description of the same constituent elements is omitted.

Referring to FIG. 7 to FIG. 9, the display device according to the present embodiment may include a flexible circuit film FS disposed in the display panel DPN including the display area DA and the non-display area NDA and the driving area DRA, and bent onto the back surface of the display panel DPN, a circuit board PS connected to the flexible circuit film FS through the connection part CT, and a plurality of electronic components CP mounted on the circuit board PS.

The circuit board PS may include a first area R1 connected to the flexible circuit film FS through the connection part CT, and a second area R2 extending from the first area R1 and including a plurality of electronic components CP.

The first area R1 of the circuit board PS is disposed on the back surface of the display panel DPN along the third direction DR3 and overlaps the display panel DPN, however is not limited thereto. In an embodiment, the second area R2 of the circuit board PS may not overlap the display panel DPN along the third direction DR3.

The display panel DPN may include a substrate 100 in which a plurality of light emitting parts 110 are disposed, an encapsulation layer 200 disposed on a plurality of light emitting parts 110 of the substrate 100, a polarization part 300 disposed on the encapsulation layer 200, a protection part 400 disposed under the substrate 100, and a circuit part 500 disposed on the substrate 100 and disposed in the non-display area NDA of the substrate 100.

The flexible circuit film FS may be connected to the substrate 100 and bent from the part connected to the substrate 100 onto the back surface of the display panel DPN, so that the part of the flexible circuit film FS may be disposed on the back surface of the display panel DPN.

The connection part CT may be disposed between the part disposed on the back surface of the display panel DPN among the flexible circuit film FS and the first area R1 of the circuit board PS, and the first area R1 of the circuit board PS and the part disposed on the back surface of the display panel DPN among the flexible circuit film FS may be connected to each other through the connection part CT. Through this, the circuit board PS and the display panel DPN may be electrically connected to each other.

A plurality of electronic components CP may be disposed in the second area R2 of the circuit board PS, and the electronic components CP may not overlap the display panel DPN along the third direction DR3.

Unlike the embodiment previously described with reference to FIG. 1 to FIG. 3, the display device according to the present embodiment may further include two moving parts HP disposed at both lower sides of the display panel DPN. The two moving parts HP are a configuration for the rotation movement of the display panel DPN, and for example, may have the same configuration as a hinge part used to open and close the display panel DPN included in an electronic device such as a laptop. The display panel DPN may be rotatable (or bendable) together with bending of the flexible circuit film FS, by the moving parts HP, without being limited thereto.

The width of the circuit board PS of the display device in (or along) the first direction DR1 according to the present embodiment may not be constant. The first width W1 of the first area R1 of the circuit board PS is greater than the second width W2 of the second area R2 of the circuit board PS, and the moving parts HP may be disposed on either side of the second area R2 of the circuit board PS along the first direction DR1. The moving parts HP may be arranged along the first direction DR1, together with the electronic components CP which are arranged along the first direction DR1. The moving parts HP and the electronic components CP may be aligned with each other along the first direction DR1, without being limited thereto.

As such, according to the display device according to the present embodiment, the second width W2 of the second area R2 of the circuit board PS which is at an end portion thereof, is formed (or provided) smaller than the first width W1 of the first area R1 of the circuit board PS, and the moving part HP is additionally disposed at opposing sides of the second area R2 of the circuit board PS. Accordingly, since no additional space (e.g., planar area) is required for disposing the moving part HP, the width of the peripheral area PA does not increase even if the moving part HP is added, so that the bezel may prevent the increase in width. That is, the different widths of the circuit board PS define a notch recessed along the second direction DR2, and the moving parts HP are respectively disposed in the notches defined at opposing ends of the circuit board PS.

Also, according to the display device according to the present embodiment, the flexible circuit film FS is bent and disposes the connection part CT and the first area R1 of the circuit board PS along the third direction DR3 on the back surface of the display panel DPN, the second area R2 of the circuit board PS does not overlap the display panel DPN along the third direction DR3, and the electronic components CP are disposed in the second area R2 of the circuit board PS. Accordingly, an increase in the thickness of the display device may be prevented while decreasing the width of the peripheral area PA measured along the second direction DR2, Many features of the display devices according to the embodiment described with reference to FIG. 1 to FIG. 3 and the embodiment described with reference to FIG. 4 to FIG. 6 are applicable to the display device according to the present embodiment.

Figure 10:
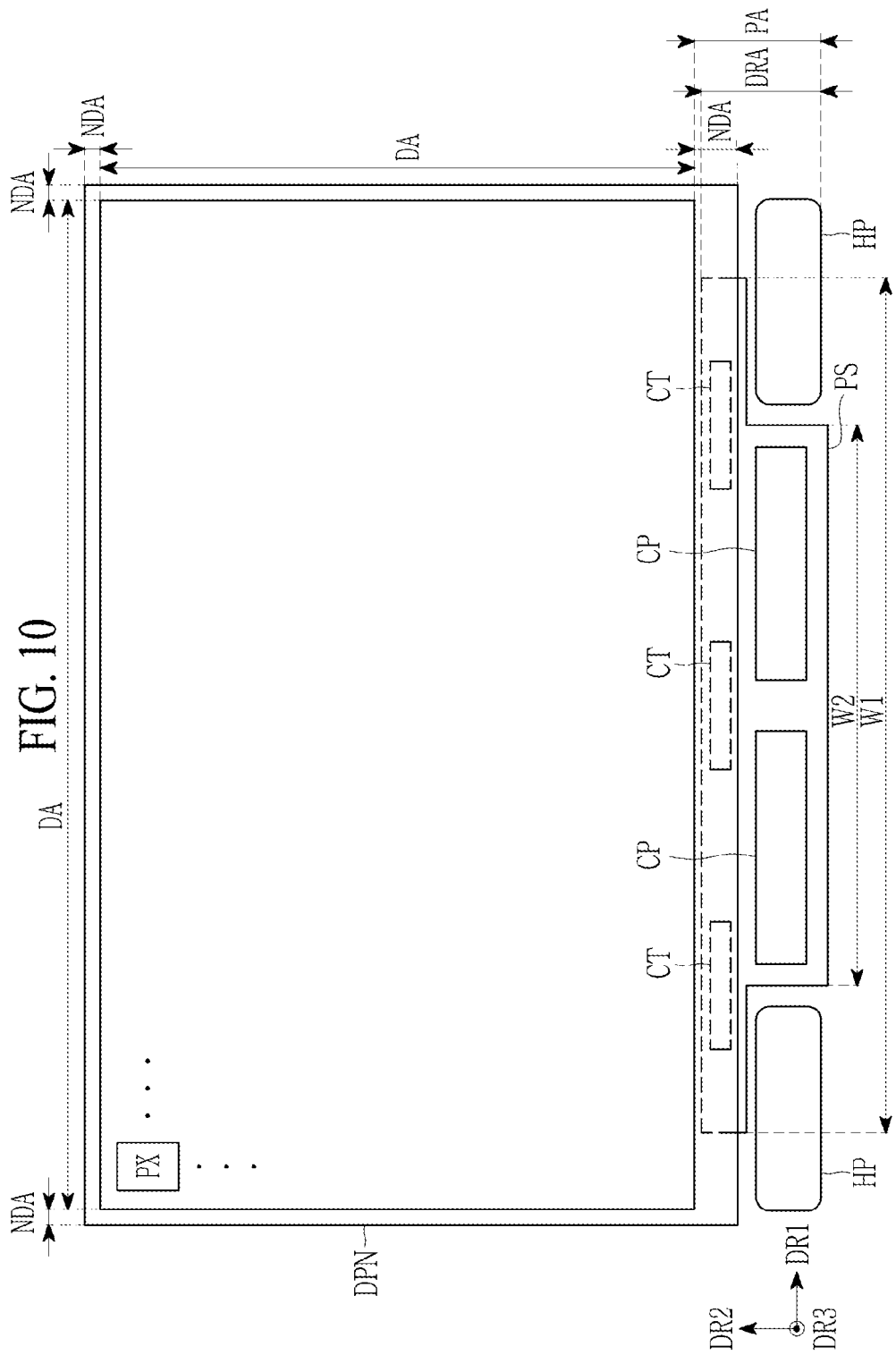
FIG. 10 is a top plan view of a display device according to an embodiment.

A display device according to an embodiment is described with reference to FIG. 10 to FIG. 12. FIG. 10 is a top plan view of a display device according to an embodiment, FIG. 11 is a top plan view showing a part of a back surface of a display device of FIG. 10, and FIG. 12 is a cross-sectional view showing a part of FIG. 10.

Figure 11:
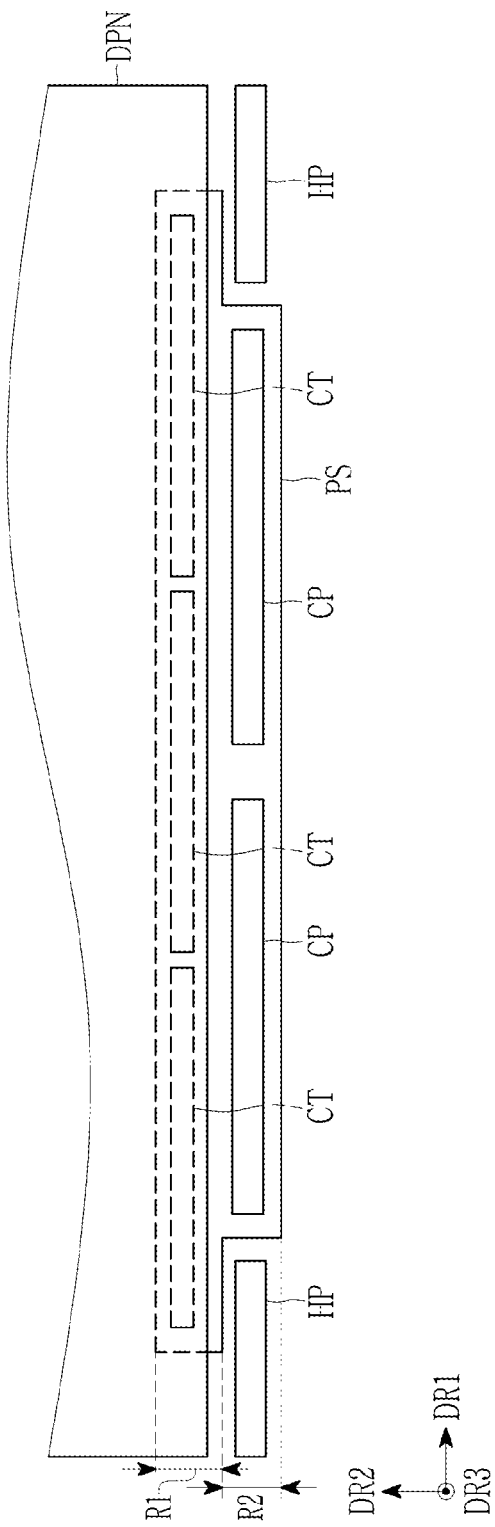
FIG. 11 is a top plan view showing a part of a back surface of a display device of FIG. 10.
Figure 12:
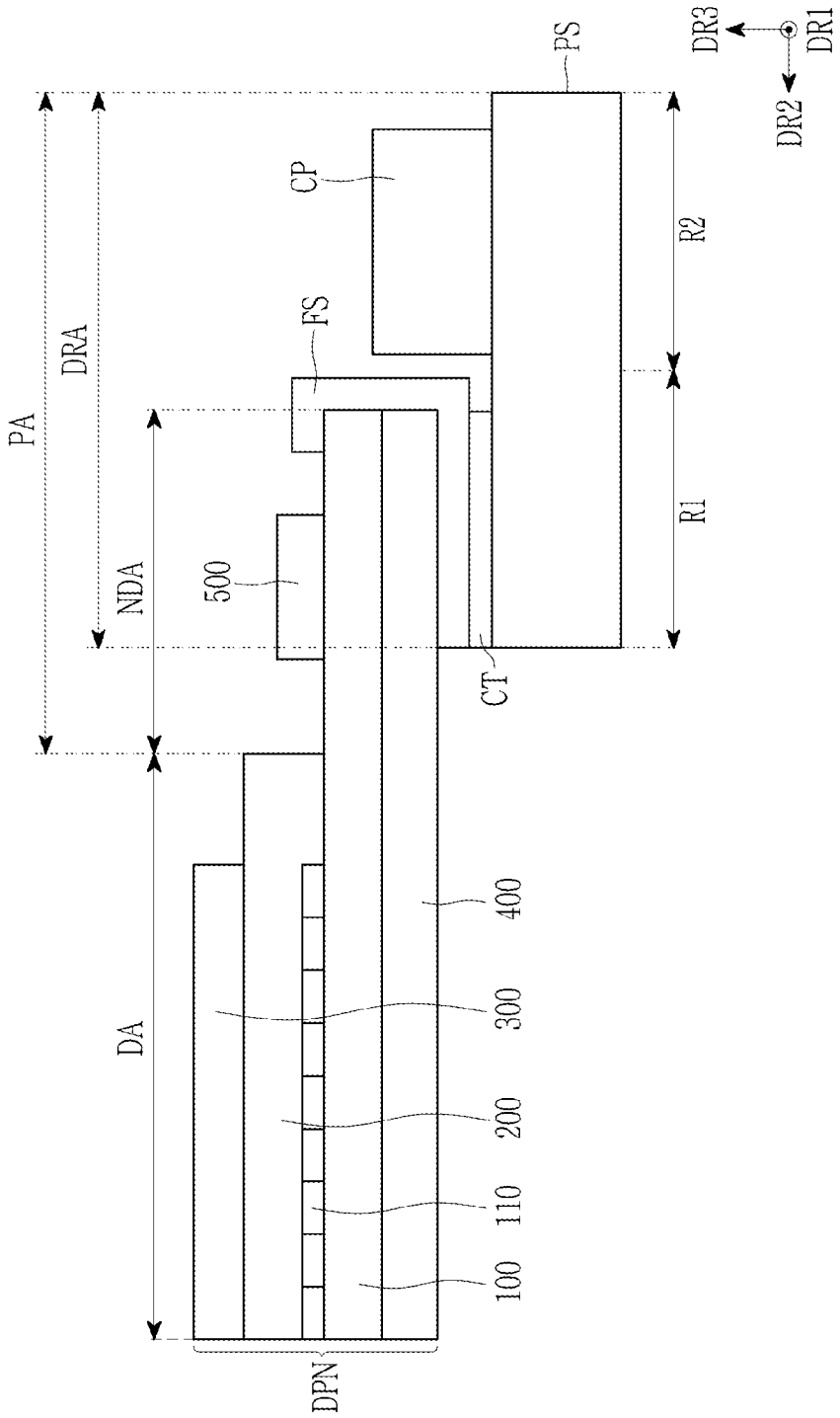
FIG. 12 is a cross-sectional view showing a part of FIG. 10.

Referring to FIG. 10 to FIG. 12, the display device according to the present embodiment is similar to the display device according to the embodiment described with reference to FIG. 7 to FIG. 9. A detailed description of the same constituent elements is omitted.

Referring to FIG. 10 to FIG. 12, the display device according to the present embodiment may include a flexible circuit film FS disposed in the display panel DPN including the display area DA and the non-display area NDA, and the driving area DRA and bent onto the back surface of the display panel DPN, a circuit board PS connected to the flexible circuit film FS through the connection part CT, and a plurality of electronic components CP mounted on the circuit board PS.

The circuit board PS may include a first area R1 connected to the flexible circuit film FS through the connection part CT, and a second area R2 extending from the first area R1 and including a plurality of electronic components CP.

The first area R1 of the circuit board PS is disposed on the back surface of the display panel DPN along the third direction DR3 and overlaps the display panel DPN, however is not limited thereto. In an embodiment, the second area R2 of the circuit board PS may not overlap the display panel DPN along the third direction DR3.

The display panel DPN may include a substrate 100 in which a plurality of light emitting parts 110 are disposed, an encapsulation layer 200 disposed on a plurality of light emitting parts 110 of the substrate 100, a polarization part 300 disposed on the encapsulation layer 200, a protection part 400 disposed under the substrate 100, and a circuit part 500 disposed on the substrate 100 and disposed in the non-display area NDA of the substrate 100.

The flexible circuit film FS may be connected to the substrate 100 and bent from the part connected to the substrate 100 onto the back surface of the display panel DPN, so that the part of the flexible circuit film FS may be disposed on the back surface of the display panel DPN.

The connection part CT may be disposed between the part disposed on the back surface of the display panel DPN among the flexible circuit film FS and the first area R1 of the circuit board PS, and the first area R1 of the circuit board PS and the part disposed on the back surface of the display panel DPN among the flexible circuit film FS may be connected to each other through the connection part CT. Through this, the circuit board PS and the display panel DPN may be electrically connected to each other.

A plurality of electronic components CP may be disposed in the second area R2 of the circuit board PS, and the electronic components CP may not overlap the display panel DPN along the third direction DR3.

The display device according to the present embodiment may further include two moving parts HP disposed at both lower sides of the display panel DPN. The width of the first direction DR1 of the circuit board PS may not be constant, the first width W1 of the first area R1 of the circuit board PS may be greater than the second width W2 of the second area R2 of the circuit board PS, and the moving part HP may be disposed on either side of the second area R2 of the circuit board PS.

As such, according to the display device according to the present embodiment, the second width W2 of the second area R2 of the circuit board PS is formed smaller than the first width W1 of the first area R1 of the circuit board PS, and the moving part HP additionally disposed is formed to be disposed on both sides of the second area R2 of the circuit board PS, and accordingly since no additional space is required for disposing the moving part HP, the width of the peripheral area PA does not increase even if the moving part HP is added, so that the bezel may prevent the increase in width.

Unlike the embodiment previously described with reference to FIG. 7 to FIG. 9, the electronic components CP of the display device according to the present embodiment may be disposed on the second area R2 of the circuit board PS along the third direction DR3, that is, extending from an upper surface of the circuit board PS which is closest to the display panel DPN. As shown in FIG. 12, the end portion of the flexible circuit film FS and the connection part CT may be between the upper surface of the circuit board PS and the lower surface of the display panel DPN.

Therefore, the electronic components CP are disposed on the second area R2 of the circuit board PS and disposed so as to not overlap the display panel DPN along the third direction DR3, so that the thickness of the third direction DR3 of the display device may be reduced.

In addition, similar to the embodiments described above, according to the display device according to the present embodiment, the flexible circuit film FS is bent and overlaps the connection part CT and the first area R1 of the circuit board PS along the third direction DR3, the second area R2 of the circuit board PS does not overlap the display panel DPN along the third direction DR3, which is the thickness direction, and the electronic components are disposed in the second area R2 of the circuit board PS. Accordingly, increase of the thickness of the display device may be prevented while decreasing the width of the peripheral area PA measured along the second direction DR2, Many features of the display devices according to the embodiment described with reference to FIG. 1 to FIG. 3, the embodiment described with reference to FIG. 4 to FIG. 6, and the embodiment described with reference to FIG. 7 to FIG. 9 are all applicable to the display device according to the present embodiment.

A display device according to an embodiment is described with reference to FIG. 13 and FIG. 14

Figure 13:
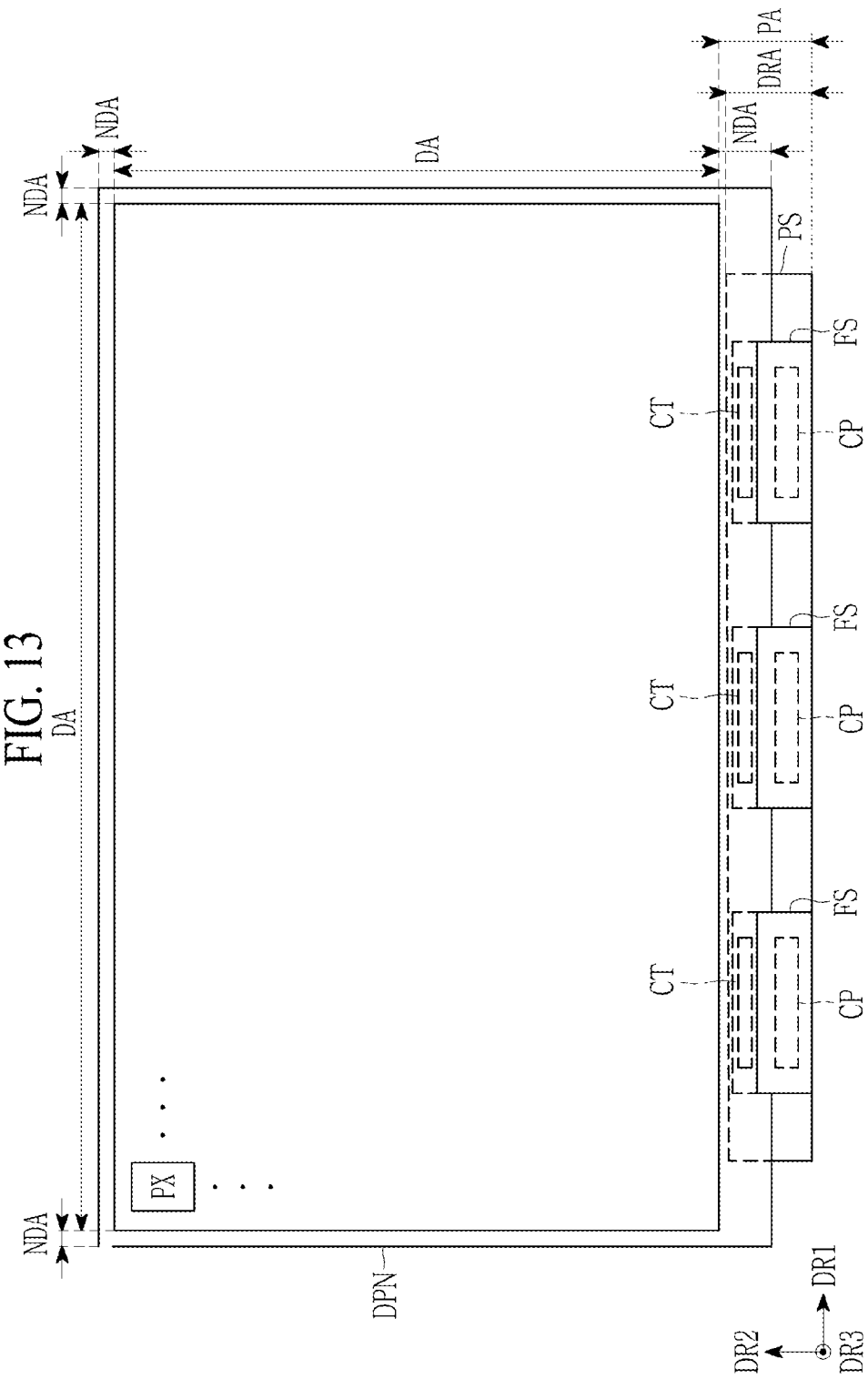
FIG. 13 is a top plan view of a display device according to an embodiment.
Figure 14:
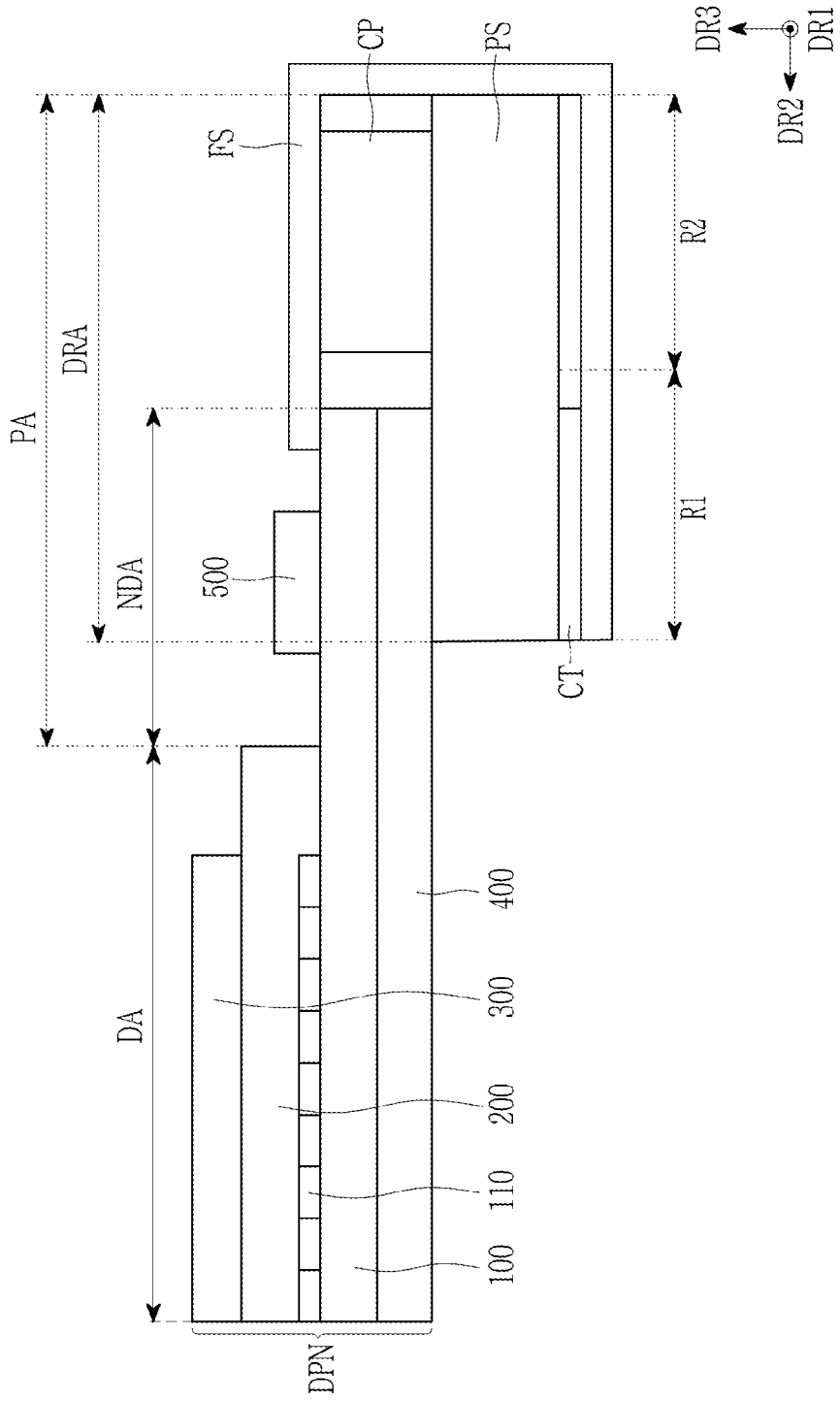
FIG. 14 is a cross-sectional view showing a part of FIG. 13.

FIG. 13 is a top plan view of a display device according to an embodiment, and FIG. 14 is a cross-sectional view showing a part of FIG. 13.

Referring to FIG. 13 and FIG. 14, the display device according to the present embodiment is similar to the display device according to the above-described embodiments. A detailed description of the same constituent elements is omitted.

Unlike the display devices according to the above-described embodiments, the flexible circuit film FS of the display device according to the present embodiment may be disposed to surround both the circuit board PS and a plurality of electronic components CP which are disposed on the circuit board PS, while being bent to the back surface of the display panel DPN.

Also, the connection part CT may be disposed under the circuit board PS. As shown in FIG. 14, the connection part CT and the circuit board PS are both between the end portion of the flexible circuit film FS and the display panel DPN. Here, the circuit board PS may form an interface with the lower surface of the display panel DPN, without being limited thereto.

A plurality of electronic components CP may be disposed over the second area R2 of the circuit board PS, and the electronic components CP may not overlap the display panel DPN along the third direction DR3.

According to the display device of the present embodiment, the flexible circuit film FS is bent to overlap the connection part CT and the first area R1 of the circuit board PS along the third direction DR3, the second area R2 of the circuit board PS does not overlap the display panel DPN, and the electronic components are disposed in the second area R2 of the circuit board PS, and an increase in thickness of the display device may also be prevented while decreasing the width of the peripheral area PA measured along the second direction DR2.

While this disclosure has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:

1. A display device comprising:
a display panel;
a circuit board connected to the display panel; and
a flexible circuit film which connects the display panel to the circuit board, the flexible circuit film being bendable;
wherein
the circuit board includes an electronic component, a first area at which the circuit board is connected to the flexible circuit film, and a second area which is adjacent to the first area and corresponds to the electronic component, and the flexible circuit film which is bent disposes the first area of the circuit board overlapping the display panel with a portion of the flexible circuit film therebetween, together with both the second area of the circuit board and the electronic component non-overlapping the display panel, along a thickness direction of the display device.

2. The display device of claim 1, further comprising a connection part which connects the flexible circuit film and the circuit board to each other, the connection part corresponding to the first area of the circuit board,
wherein the flexible circuit film which is bent further disposes the display panel, the flexible circuit film, the connection part, and the first area of the circuit board overlapping each other, along the thickness direction of the display device.

3. The display device of claim 2, wherein the flexible circuit film which is bent further disposes the flexible circuit film, the connection part and the first area of the circuit board in order from the display panel, along the thickness direction of the display device.

4. The display device of claim 1, wherein the flexible circuit film which is bent further disposes:
the circuit board including an upper surface closest to the display panel, and a lower surface opposite to the upper surface, along the thickness direction of the display device, and
the electronic component on the lower surface of the circuit board.

5. The display device of claim 1, wherein the flexible circuit film which is bent further disposes:
the circuit board including an upper surface closest to the display panel, along the thickness direction of the display device, and
the electronic component on the upper surface of the circuit board.

6. The display device of claim 2, wherein the flexible circuit film which is bent further disposes:
the first area of the circuit board, the connection part and the flexible circuit film in order from the display panel, along the thickness direction of the display device,
the circuit board including an upper surface closest to the display panel, and
the electronic component on the upper surface of the circuit board.

7. A display device comprising:
a display panel;
a circuit board connected to the display panel; and
a flexible circuit film which connects the display panel to the circuit board, the flexible circuit film being bendable;
wherein
the circuit board includes an electronic component, a first area at which the circuit board is connected to the flexible circuit film, and a second area which is adjacent to the first area and corresponds to the electronic component,
the flexible circuit film which is bent disposes a portion of the flexible circuit film overlapping the display panel with the first area of the circuit board therebetween, together with both the second area of the circuit board and the electronic component non-overlapping the display panel, along a thickness direction of the display device, the flexible circuit film which is bent extends from the first area of the circuit board to the display panel and surrounds each of of the circuit board and the electronic component.

8. The display device of claim 1, further comprising a hinge part at which the display panel is foldable, the hinge part disposed adjacent to the second area of the circuit board.

9. The display device of claim 8, wherein
the first area of the circuit board is adjacent to the second area along a first direction, and
a width of the first area and a width of the second area of the circuit board, along a second direction crossing the first direction, are different from each other.

10. The display device of claim 9, wherein the width of the first area of the circuit board is greater than the width of the second area of the circuit board.

11. A display device comprising:
a display panel including a display area, and a non-display area which is adjacent to the display area;
a circuit board connected to the display panel;
a flexible circuit film which connects the display panel to the circuit board and is bendable;
the flexible circuit film connected to the display panel at the non-display area, and connected to the circuit board at a first area of the circuit board; and
a driving area including a portion of the flexible circuit film corresponding to the first area of the circuit board, together with the circuit board connected to the flexible circuit film,
wherein the flexible circuit film which is bent disposes the first area of the circuit board overlapping the display panel with the portion of the flexible circuit film therebetween, along a thickness direction of the display panel.

12. The display device of claim 11, further comprising:
a connection part which connects the flexible circuit film and the circuit board to each other, the connection part corresponding to the first area of the circuit board and the portion of the flexible circuit film; and
an electronic component corresponding to a second area of the circuit board which is adjacent to the first area and further from the connection part than the first area,
wherein
the driving area further includes the connection part, the electronic component and the second area of the circuit board, and
the flexible circuit film which is bent further disposes the connection part overlapping the display panel, together with the electronic component and the second area of the circuit board non-overlapping the display panel, along the thickness direction of the display panel.

13. The display device of claim 12, wherein the flexible circuit film which is bent further disposes:
the circuit board including an upper surface closest to the display panel, and a lower surface opposite to the upper surface, along the thickness direction of the display panel, and
the electronic component on the lower surface of the circuit board.

14. The display device of claim 12, wherein the flexible circuit film which is bent further disposes:
the circuit board including an upper surface closest to the display panel, along the thickness direction of the display panel, and
the electronic component on the upper surface of the circuit board.

15. The display device of claim 12, wherein the flexible circuit film which is bent further disposes the driving area overlapping the non-display area of the display panel, along the thickness direction of the display panel.

16. The display device of claim 15, wherein the flexible circuit film which is bent further disposes:
the first area of the circuit board, the connection part and the portion of the flexible circuit film of the driving area, in order from the display panel, along the thickness direction of the display panel,
the circuit board including an upper surface closest to the display panel,
the electronic component on the upper surface of the circuit board, and
the flexible circuit film surrounding the first area and the second area of the circuit board and the electronic component.

17. The display device of claim 12, further comprising a hinge part at which the display panel is foldable, the hinge part disposed adjacent to the second area of the circuit board.

18. The display device of claim 17, wherein
the first area of the circuit board is adjacent to the second area along a first direction, and
a width of the first area and a width of the second area of the circuit board, along a second direction crossing the first direction, are different from each other.

19. The display device of claim 18, wherein the width of the first area of the circuit board is greater than the width of the second area of the circuit board.

* * * * *